United States Patent [19]

Smarandoiu et al.

[11] Patent Number: 5,434,815
[45] Date of Patent: Jul. 18, 1995

[54] STRESS REDUCTION FOR NON-VOLATILE MEMORY CELL

[75] Inventors: George Smarandoiu, San Jose; Steven J. Schumann, Sunnyvale; Tsung-Ching Wu, Saratoga, all of Calif.

[73] Assignee: Atmel Corporation, San Jose, Calif.

[21] Appl. No.: 184,227

[22] Filed: Jan. 19, 1994

[51] Int. Cl.$^6$ ............................................. G11C 7/00
[52] U.S. Cl. ............................ 365/189.01; 365/184; 365/218
[58] Field of Search ................ 365/189.01, 185, 218, 365/184

[56] References Cited

U.S. PATENT DOCUMENTS

4,179,626 12/1979 Oehler ................................. 307/238

Primary Examiner—Joseph A. Popek
Assistant Examiner—F. Niranjan
Attorney, Agent, or Firm—Schneck & McHugh

[57] ABSTRACT

Non-volatile semiconductor core memory performance is enhanced by reduced stress on core memory cells. Stress is reduced by selectable application of bias voltages to the sense line under control of the word line. The word line is connected to an inverting device in turn connected to a transistor effective for grounding the gate of a variable threshold programmable transistor in the memory cell. Power down of the word line is reflected in synchronous power-down of the sense line. Additionally, with power down, the sense amplifier for the particular core memory cell is disconnected from a master latch circuit, which in turn is connected to a slave latch circuit for applying the previous sense amplifier output to an input/output buffer, in order to secure the data sensed in core memory during read operation. The invention further permits reduced word line voltages during erase operation on the sense line and the variable threshold programmable transistor.

16 Claims, 6 Drawing Sheets

STRESS REDUCTION FOR NON-VOLATILE MEMORY CELL

TECHNICAL FIELD

The invention relates to methods for reducing stress in a non-volatile semiconductor memory.

BACKGROUND ART

Non-volatile memory devices, such as electrically programmable and UV erasable read only memories (EPROMs) and electrically erasable and programmable read only memories (EEPROMs), comprise core arrays of memory cells, with each cell including a variable threshold transistor. Such transistors are programmable by shifting the voltage threshold for conduction.

Figure 1:
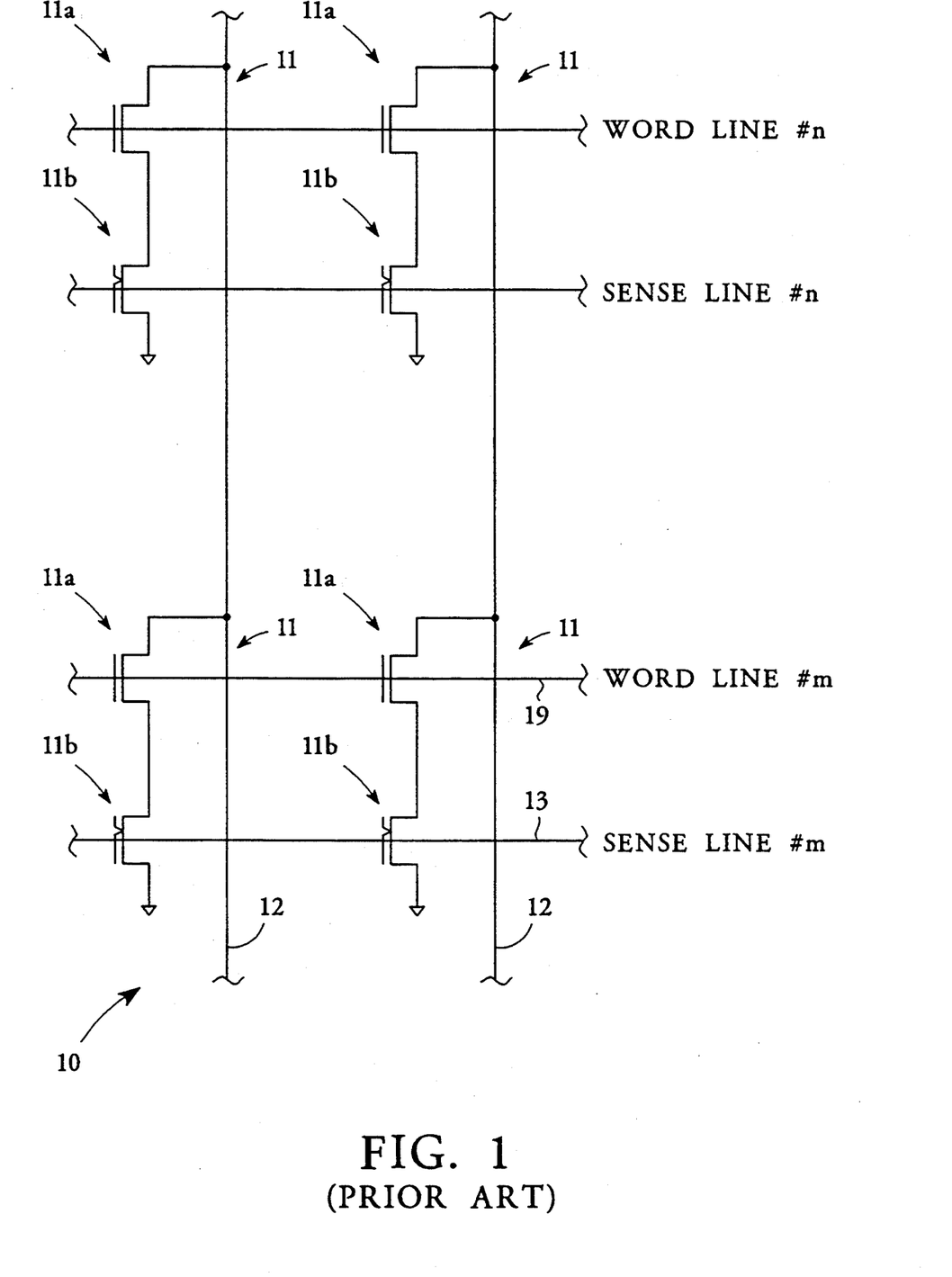
FIG. 1 shows a non-volatile semiconductor memory core arrangement comprising two-transistor cells according to the prior art.

FIG. 1 shows a portion of a memory array 10 according to the prior art, including memory cells 11, each memory cell in turn including a pair of transistors, the first one being a select transistor 11a and the second being a variable threshold transistor 11b. According to one version of the prior art, the select transistors 11a are n-channel enhancement transistors, and the variable threshold transistors 11b are n-channel native transistors. Other kinds of memory cells 11 including a greater number of transistors are known in the prior art as well.

The memory cells 11 shown in FIG. 1 are interconnected by bit lines 12, sense lines 13, and word lines 19, as shown. In particular, the drains of the n-channel enhancement select transistors 11a will be connected to an adjacent bit line 12. The gates of select transistors 11a and variable threshold transistors 11b will respectively be connected to adjacent word lines 19 and sense lines 13.

Figure 2:
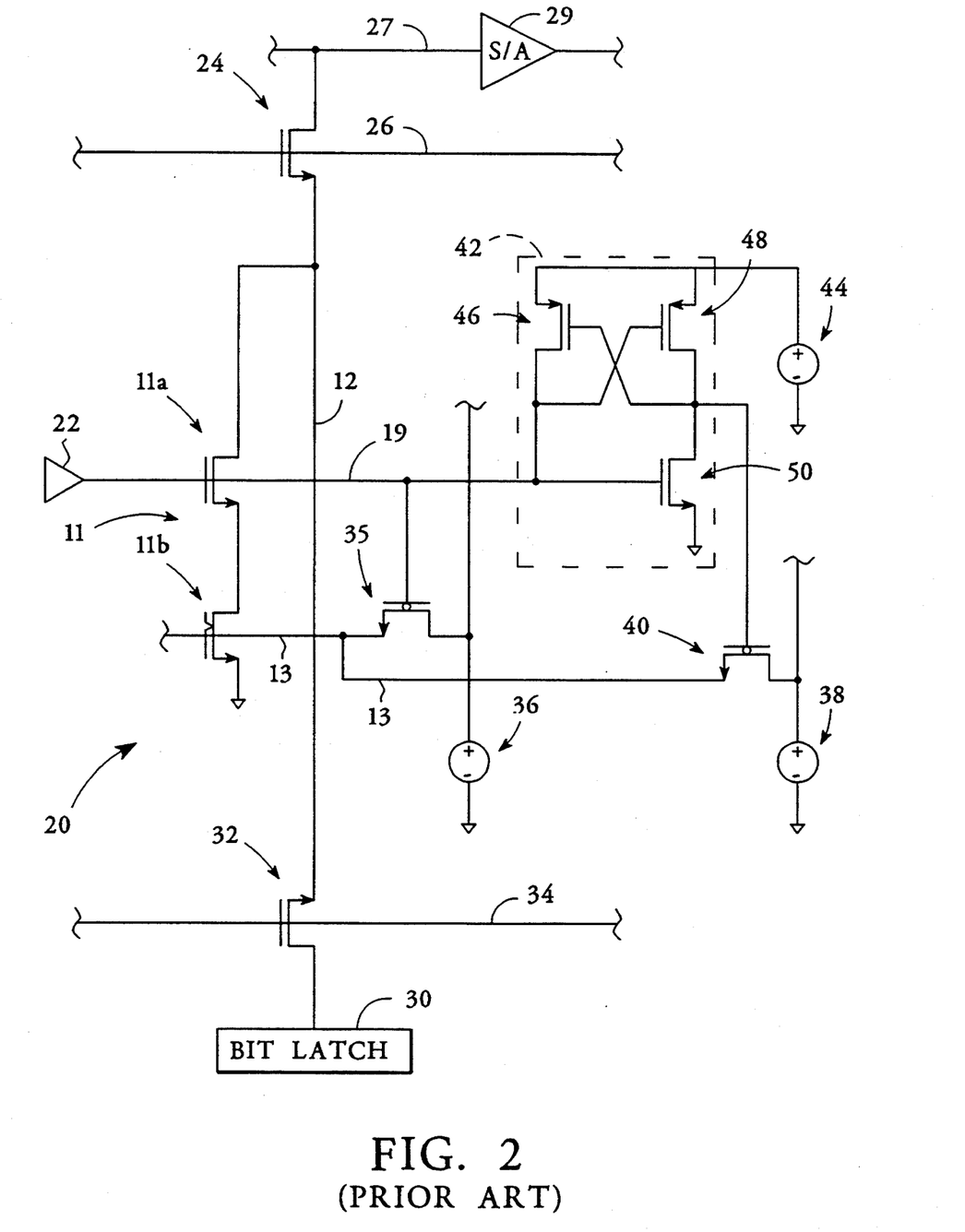
FIG. 2 shows a non-volatile semiconductor memory arrangement according to the prior art, which includes a sense amplifier arrangement.

FIG. 2 shows a non-volatile memory arrangement 20 of the prior art, including a selected portion of memory array 10 from FIG. 1. Again, memory cell 11 is shown including a pair of transistors respectively select transistor 11a and variable threshold transistor 11b. As before, according to an n-channel implementation of select and variable threshold transistors, 11a and 11b, the drain of select transistor 11a will be connected to bit line 12, and the respective gates of select and variable threshold transistors, 11a and 11b, will be connected respectively to word and sense lines, 19 and 13. Word line 19 is driven by a word line decoder 22 which is subject to control signals, PWRUP, which it has been programmed to recognize.

Additionally shown in prior art FIG. 2 is read select transistor 24 which is connected to read select line 26. When read operation is active, read select transistor 24 is turned on, electrically connecting bit line 12 to a data bus 27 which is connected to a sense amplifier 29. Bit line 12 is further connected to a bit latch 30 through a programming select transistor 32 which is controlled at its gate by a programming select line 34. According to a typical arrangement of the prior art, read select transistor 24 is an n-channel enhancement transistor, and programming select transistor 32 is an n-channel enhancement transistor.

Word line 19 of FIG. 2 according to the prior art is connected to a word line latch 42 which is provided with a word line bias voltage, VWL, from word line voltage source 44. Word line latch 42 includes word line latch transistors 46 and 48. Word line latch transistors 46 and 48 are connected at their sources to the positive voltage side of word line voltage source 44. The respective gates of word line latch transistors 46 and 48 are connected to each other's drains. In other words, the gate of word line latch transistor 46 is connected to the drain of word line latch transistor 48, and the gate of word line latch transistor 46 is connected to the drain of word line latch transistor 48. Word line latch 42 additionally includes an n-channel enhancement word line latch transistor 50 which is connected at its gate to word line 19 and to the drain of word line latch transistor 46. The drain of word line latch transistor 50 is connected to the gate of word line latch transistor 46 and to the drain of word line latch transistor 48.

Sense line 13 in prior art FIG. 2 is further connected to first and second reference pass transistors 35 and 40, both of them being n-channel enhancement devices, at their respective sources. The respective drains of first and second reference pass transistors 35 and 40 are connected to the respective positive sides of first and second reference voltage sources, 36 and 38. The gates of respective first and second reference pass transistors 35 and 40, are connected respectively to word line 19 and to the output of word line latch 42.

According to the prior art, when the circuitry of FIG. 2 is subject to read operation, the conductive state of memory cell 11 is queried by connecting bit line 12 to sense amplifier 29 and by applying appropriate bias voltages to the selected bit, sense, and word lines 12, 13, and 19. If cell select transistor 11a is turned on and the bias voltage applied to the sense line 13 exceeds the threshold of the variable threshold transistor 11b, then current will flow from bit line 12 to ground through cell 11, and sense amplifier 29 will detect a "low" state, which is so defined according to convention. Conversely, if the bias voltage applied to sense line 13 does not exceed the threshold of variable threshold transistor 11b, then no current will flow through cell 11, and sense amplifier 29 will detect a "high" state.

Thus, the low or high state of a particular cell 11 corresponds to the low or high threshold of variable threshold transistor 11b. Irrespective of the conductive state of selected memory cell 11 during a read operation, particular bias voltages will be applied to its respective terminals, i.e., bit line 12, sense line 13, and word line 19. While these bias voltages will have had the desired effect of providing the necessary stimulus for detecting the conductive state of memory cell 11, the bias voltages also may have had the undesirable effect of disturbing the programmed state of variable threshold transistor 11b. This deleterious effect of the various bias voltages is unfortunately enhanced by time, i.e., the longer the particular voltage biases are applied, the more likely it is that the programmed threshold of transistor 11b will have been disturbed. Thus, the bias voltages applied to memory cell 11 act as undesired stress voltages.

During programming operation, the bias voltages applied to the various terminals of memory cell 11 are much higher than those applied during read operation. Again, while these high bias voltages have the desired effect of modifying the threshold of the programmable memory cell 11, they also have the undesired effect of stressing the various transistors in memory cell 11, which causes a negative impact on long term reliability.

Accordingly, an object of the invention is to reduce stress during read and programming operations of the memory cells in semiconductor memory arrays by minimizing the amount of time that the various bias voltages are applied to the memory cells.

A further object of the invention is to increase the effective operable lifetime and reliability of the core memory in non-volatile semiconductor memory arrays.

SUMMARY OF THE INVENTION

The above objects are achieved in a nonvolatile semiconductor memory by the employment of multiple word-line driven reference voltage pass devices for selectively applying a predetermined single voltage bias to the sense line at a plurality of sense line locations distributed at selected locations of the sense line, to ensure immediate application of bias voltages to the sense line, when directed by a word line signal applied to the reference voltage pass devices. The sense line is connected to a sense line latch and a sense line grounding device. According to this arrangement, read bias voltages are applied for only as long as required for determining the conductive state of the selected memory cell, and one of the high voltage biases normally applied during programming operation is eliminated as well.

Read bias control is accomplished by synchronizing read bias voltage application with address changes. Accordingly to the technique, word line bias signals are applied for a limited time following an address change from one core memory cell to another. Further, the sense line bias is applied only as long as the word line is active. Synchronization of sense line bias with word line bias is achieved by using word line driven reference voltage pass devices connecting the reference bias supply to the sense line at distributed locations thereof, and by connecting the self-decoding latch and a sense line grounding device to the sense line. The sense line grounding device is driven by a word line latch.

During read operation, the bit line corresponding to a selected memory cell is connected to the sense amplifier by opening a read select transistor. The word line corresponding to the particular memory cell is selected by a word line decoder. Finally, the sense line is connected to its reference bias through a word line driven reference voltage pass transistor. All the memory cells sharing the selected word and sense lines will see the same bias on the gates of the cell select and variable threshold transistors, but will be driven on the bit line side only if selected by a read select transistor. Among the cells sharing a bit line only the cell with a selected word line will see a drain bias on the variable threshold transistor. All the memory cells sharing non-selected word lines will be biased at zero volts on both the cell select transistor as well as on the variable threshold transistor gates. The stress on the selected cells is reduced by applying bias voltages synchronously following an address transition detection (ATD) and then removing the bias after storing the result of the sensing operation. Since this approach requires switching of the sense line bias from zero to VREF, both the number and actual physical layout of the pass transistors used for connection of reference voltage bias to the sense line is made compatible with the targeted switching speed by including a plurality of reference voltage pass transistors distributed over the length of the sense line.

During erase operation, the word line associated with a selected memory cell, the reference voltage supply, and the word line latch voltage supply are all set at the same potential. However, the sense line latch voltage supply is set to a very high voltage level. Accordingly, while the voltage level on the sense line will be at a very high level in order to accomplish erase, the voltage levels applied to the select transistor of the selected memory cell during erase are set at a much lower stress level. Additionally, the voltages applied to the reference voltage pass transistors, whether selected or not, will be much lower than the very high level applied to the sense line in order to accomplish erase operation.

BEST MODE FOR CARRYING OUT THE INVENTION

Figure 3:
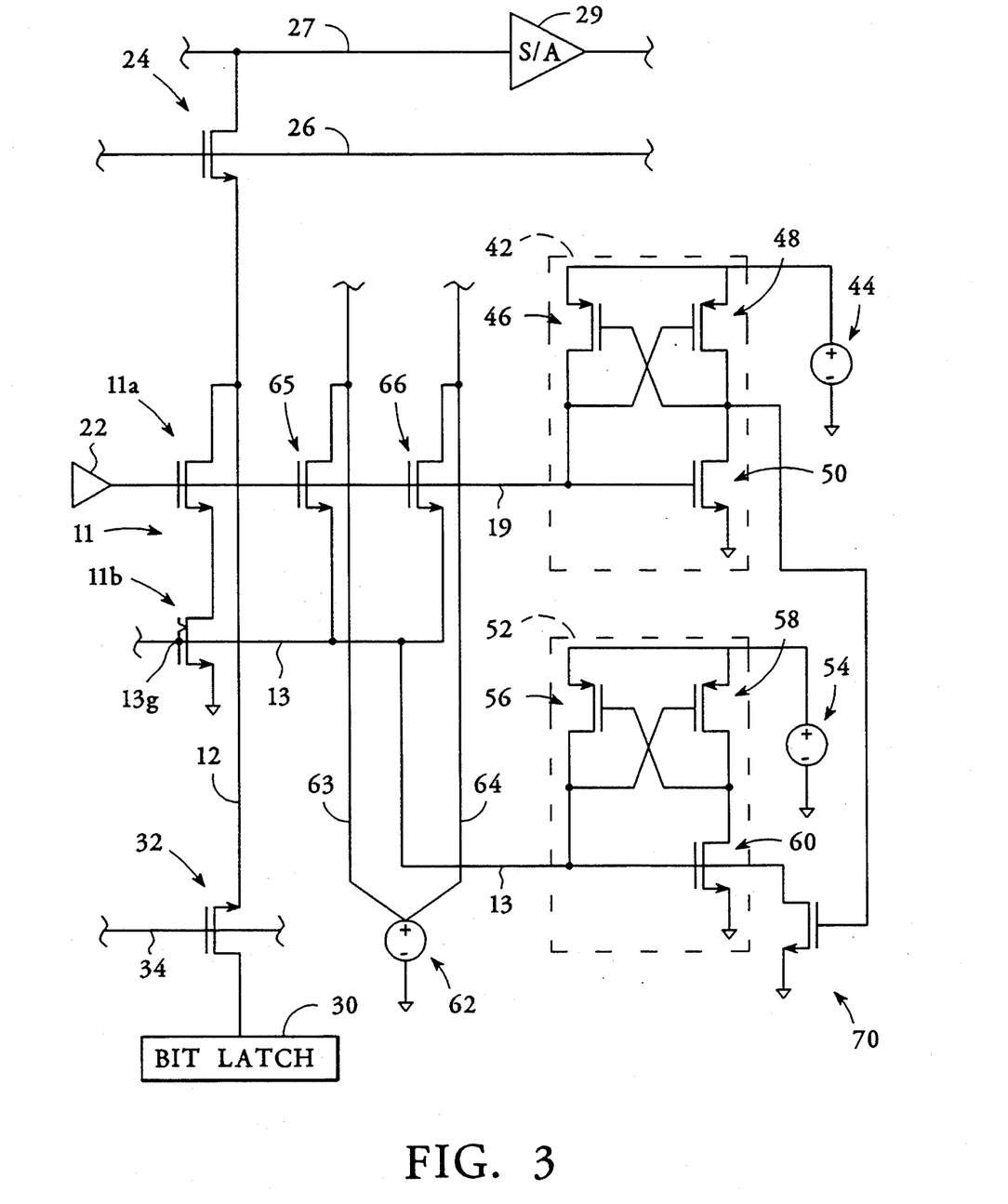
FIG. 3 shows a non-volatile semiconductor memory arrangement according to the invention herein, including inventive multiple reference voltage pass devices driven by the word line, as well as an inventive sense line latch and sense line grounding device.

FIG. 3 shows a non-volatile memory arrangement according to the invention herein. Memory cell 11 is shown including a pair of transistors respectively select transistor 11a and variable threshold transistor 11b. The memory state of variable threshold transistor 11b is either "high" or "low." This memory state is considered to be data which is sensed during read operation or programmed during programming operation.

According to an n-channel implementation of select and variable threshold transistors, 11a and 11b, the drain (or output connection) of select transistor 11a will be connected to bit line 12, and the respective gates of select and variable threshold transistors, 11a and 11b, will be connected respectively to word and sense lines, 19 and 13. Word line 19 is driven by a word line decoder 22 which is subject to a control signal, PWRUP, which it has been programmed to recognize. For convenience herein, the gate, source and drain of the various transistors herein may be referred to as the control, input and output connections thereof.

Additionally shown in FIG. 3 is read select transistor 24 which is connected to read select line 26 at its gate. When read operation is active, read select transistor 24 is turned on, electrically connecting bit line 12 to a data bus 27 which is connected to sense amplifier 29. Bit line 12 is further connected to a bit latch 30 subject to control of programming select line 34 connected to the gate of programming select transistor 32. According to a typical arrangement of the prior art, read select transistor 24 will be an n-channel enhancement transistor, and programming select transistor 32 will be an n-channel enhancement transistor.

Word line 19 of FIG. 3 is connected to word line latch 42 which is provided with a word line bias voltage, VWL, from word line voltage source 44. Word line latch 42 includes word line latch transistors 46 and 48. Word line latch transistors 46 and 48 are connected at their sources to the positive voltage side of word line voltage source 44. The respective gates of word line latch transistors 46 and 48 are connected to each other's drains. In other words, the gate of word line latch transistor 46 is connected to the drain of word line latch transistor 48, and the gate of word line latch transistor 46 is connected to the drain of word line latch transistor 48. Word line latch 42 additionally includes an n-channel enhancement word line latch transistor 50 which is connected at its gate to word line 19 and to the drain of word line latch transistor 46. The drain of word line latch transistor 50 is connected to the gate of a grounding transistor 70.

Sense line 13 of FIG. 3 is connected to sense line latch 52 which is provided with a sense line bias voltage, VSL, from a sense line voltage source 54. Sense line latch 52 includes sense line latch transistors 56 and 58. Sense line latch transistors 56 and 58 are connected at their sources to the positive voltage side of sense line voltage source 54. The respective gates of sense line latch transistors 56 and 58 are connected to each other's drains. In other words, the gate of sense line latch transistor 56 is connected to the drain of sense line latch transistor 58, and the gate of sense line latch transistor 56 is connected to the drain of sense line latch transistor 58. Sense line latch 52 additionally includes an n-channel enhancement sense line latch transistor 60 which is connected at its gate to sense line 13, to the drain of sense line latch transistor 56, and to the drain of grounding transistor 70. The drain of sense line latch transistor 60 is connected to the gate of sense line latch transistor 56.

During read operation and power-up, bit line 12 corresponding to memory cell 11 is connected to sense amplifier 29 by opening read select transistor 24. Word line 19 is selected by word line decoder 22. Finally, sense line 13 is connected to reference bias voltage 62 through one or more word line driven reference voltage pass transistors such as 65 and 66. At this point of read operation, the sense line latch voltage source 54, VSL, is set to VREF; the word line latch voltage source 44, VWL, is set to Vcc. The reference bias voltage 62 is also set to VREF, of course. Consequently, the bias voltages applied to the memory cell 11 are as follows. The bit line 12 is clamped to a relatively low voltage by the sense amplifier 29. This relatively low voltage is essentially virtual ground or approximately two volts in amplitude. Further, the word line 19 is set to Vcc, which is preferably at five volts, according to a preferred embodiment. Finally, the sense line 13 is at VREF, which is the bias voltage used to determine the conductive state of variable threshold transistor 11b. According to a preferred embodiment, VREF is approximately two volts. Moreover, the output of word line latch 42 is low, ensuring that grounding transistor 70 is off and does not conduct.

All the memory cells sharing the selected word and sense lines, respectively 19 and 13, will see the same bias on the gates of their associated cell select and variable threshold transistors, but they will be driven on their associated bit line sides only if selected by an associated read select transistor. Among the memory cells sharing a bit line, only memory cell 11 which additionally has a selected word line, will see a drain bias on its variable threshold transistor, i.e., 11b. All the memory cells sharing non-selected word lines will be biased at zero volts on both their select transistor gates, as well as on their variable threshold transistor gates.

The stress on a selected memory cell 11 during read operation and power-up is reduced by applying bias voltages synchronously following an address transition detection (ATD), and then removing the bias incident to power-down after storing the result of the sensing operation. Since this approach requires switching of the sense line bias from zero to VREF, both the number and actual physical layout positioning of pass transistors 65 and 66 used for connection of an associated reference bias line 63 or 64 to the sense line 13 is made compatible with the targeted switching speed by including a plurality of pass transistors 65, 66 distributed at several locations over the length of the sense line 13.

During erase operation, word line 19 associated with a selected memory cell 11, reference bias voltage 62, and word line latch voltage supply 44 are all set at the same potential. However, sense line latch voltage supply 54 is set to a very high voltage level. Accordingly, while the voltage level on sense line 13 will be at a very high level in order to accomplish erase, the voltage levels applied to select transistor 11a of selected memory cell 11 are set at a much lower stress level. Additionally, the voltages applied to reference pass transistors 65 and 66, whether selected or not, will be much lower than the very high level applied to sense line 13 in order to accomplish erase operation.

Figure 4:
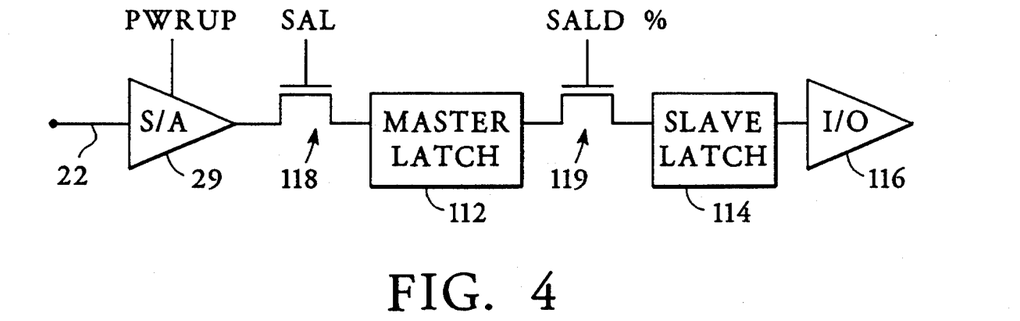
FIG. 4 is a circuit arrangement for latching the sensed data in connection with ATD controlled power-up of the sense amplifier and a selected word line.

FIG. 4 shows electric circuitry employed in connection with power-down and power-up operation under the invention addressed herein. In order to be able to remove the bias applied to a memory cell during read, the result of sensing operation must be stored. This is accomplished through the use of a master-slave latch arrangement. Before power-up and during sensing, the master latch circuit 112 is connected to the sense amplifier 29 through transistor 118 driven by the signal, SAL. The slave latch circuit 114 is connected to input/output circuitry 116 for receiving information from the sense amplifier 29. It is disconnected from the master latch circuit 112 by transistor 119, which is driven by the signal, SALD%.

At the conclusion of the allowed sensing time interval, SAL goes low, disconnecting the master latch circuit 112 from the sense amplifier 29. Following the high to low transition of SAL, signal SALD% goes high, and the contents of the master latch circuit 112 are transferred to the slave latch circuit 114 and the input/output circuitry 116. The connection between the master latch circuit 112 and the slave latch circuit 114 is kept as short as possible, i.e., SALD% is pulsed high for a short time. Following the high to low transition of SALD%, SAL goes back to high, and the master latch circuit 112 is ready to receive new input from the sense amplifier 29. If no address change occurs, then the sense amplifier 29 is powered down.

This arrangement makes it possible to initiate a new read cycle as soon as the master latch circuit 112 is disconnected from the sense amplifier 29, thus overlapping the new cycle with the previous one. In other words, the memory can be used in a "pipe line" mode.

Figure 5:
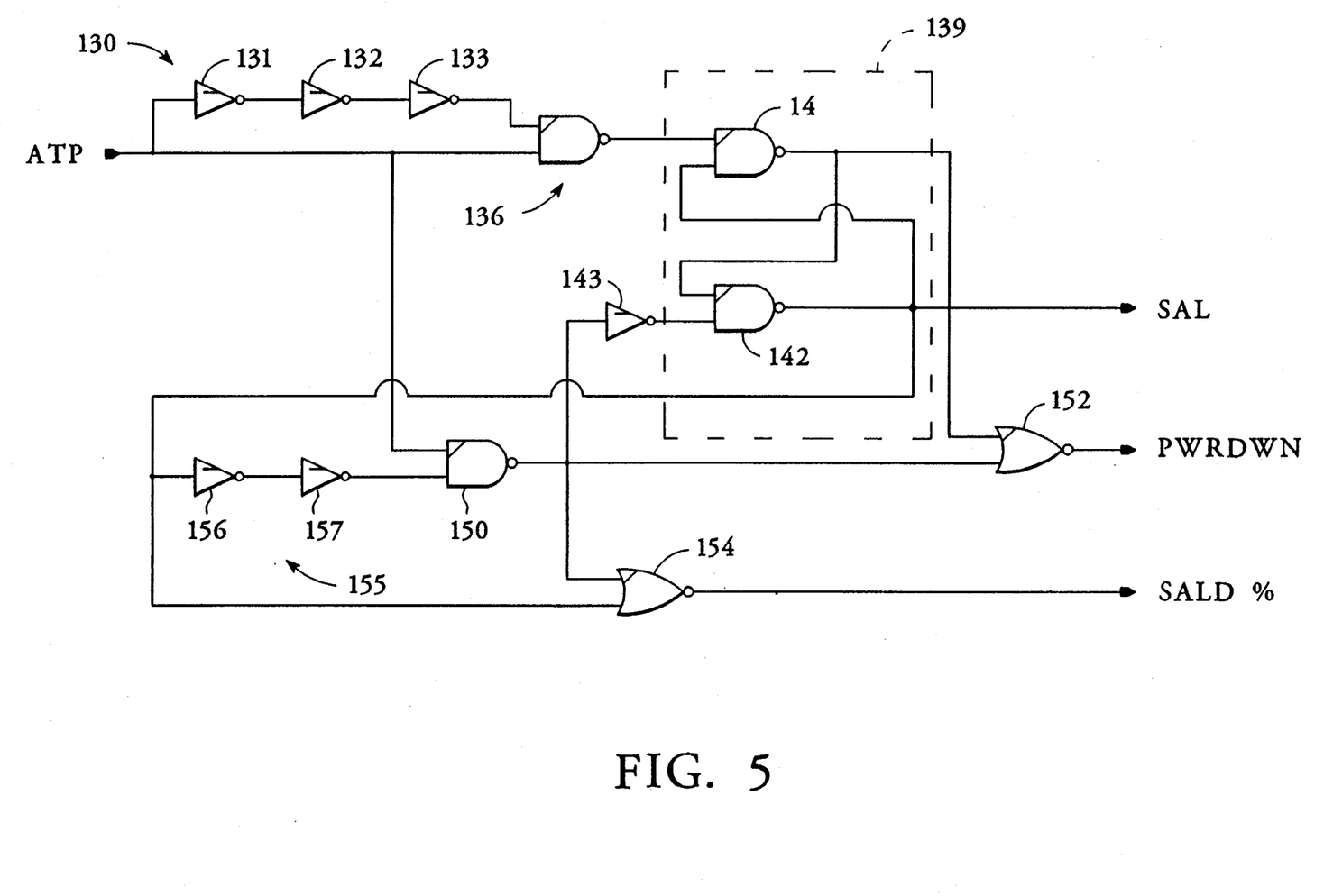
FIG. 5 is an electric circuit effective for producing the power-down and control signals in connection with the invention herein.

FIG. 5 is an electric circuit effective for producing the needed power-down and control signals in connection with the invention herein. In particular, there is shown a control circuit in receipt of an input signal, ATP, which is applied to an inverter bank 130 including first, second, and third inverters 131, 132, and 133, respectively. The ATP signal is additionally applied to the input of NAND gate 136. The output of inverter 133 is also provided as an input to NAND gate 136. The effect of this circuit combination is to produce a limited width pulse output from NAND gate 136 defined by the delay caused by inverters 131, 132, and 133. As will be indicated with respect to the timing diagram of FIG. 6, the input signal, ATP, will make a high to low transition at a particular point in time when address transition occurs. The other input to NAND gate 136 from inverter 133 will at that point be low, because of the earlier high steady state of ATP. The output of NAND gate 136 will only be low if both of its inputs are high. Accordingly, the output of NAND gate 136 will be high during the steady state of ATP. Further, the steady state of the output of the third inverter 133 is low, which sets up a low transition for the output of NAND gate 136 when ATP, i.e., the input of inverter 131, transitions high.

The initial low transition of ATP accordingly keeps the output of NAND gate 136 high and begins a ripple of transitions through inverters 131, 132, and 133.

The duration of the low ATP pulse is such as to allow for proper read operation. When ATP goes back high, the high transition at the input side of inverter 131 will be reflected by an output low pulse from NAND gate 136 of predetermined width. This pulse acts as a reset signal to the RS type latch 139 formed by NAND gates 140 and 142 and causes a low transition of output signal SAL.

Input signal ATP is additionally provided as an input to NAND gate 150 which receives further the twice inverted (and thus by passage through first and second inverters 156 and 157, delayed) input of signal, SAL. SAL additionally serves with the output of NAND gate 150 as combined input into NOR gate 154 to produce output signal SALD%. The only time the output of NOR gate 154 can be high is during the narrow window in time when ATP and SAL are out of synch. This period of time to be out of synch, however, expires with a time period dictated by the time delay introduced by first and second inverters, 156 and 157, as will be seen with respect to the timing diagram of FIG. 6. The circuitry of FIG. 5 further provides for production of a powerdown signal, PWRDWN, which is produced by NOR gate 152, which has as its inputs the output of NAND gates 140 and 150.

Figure 6:
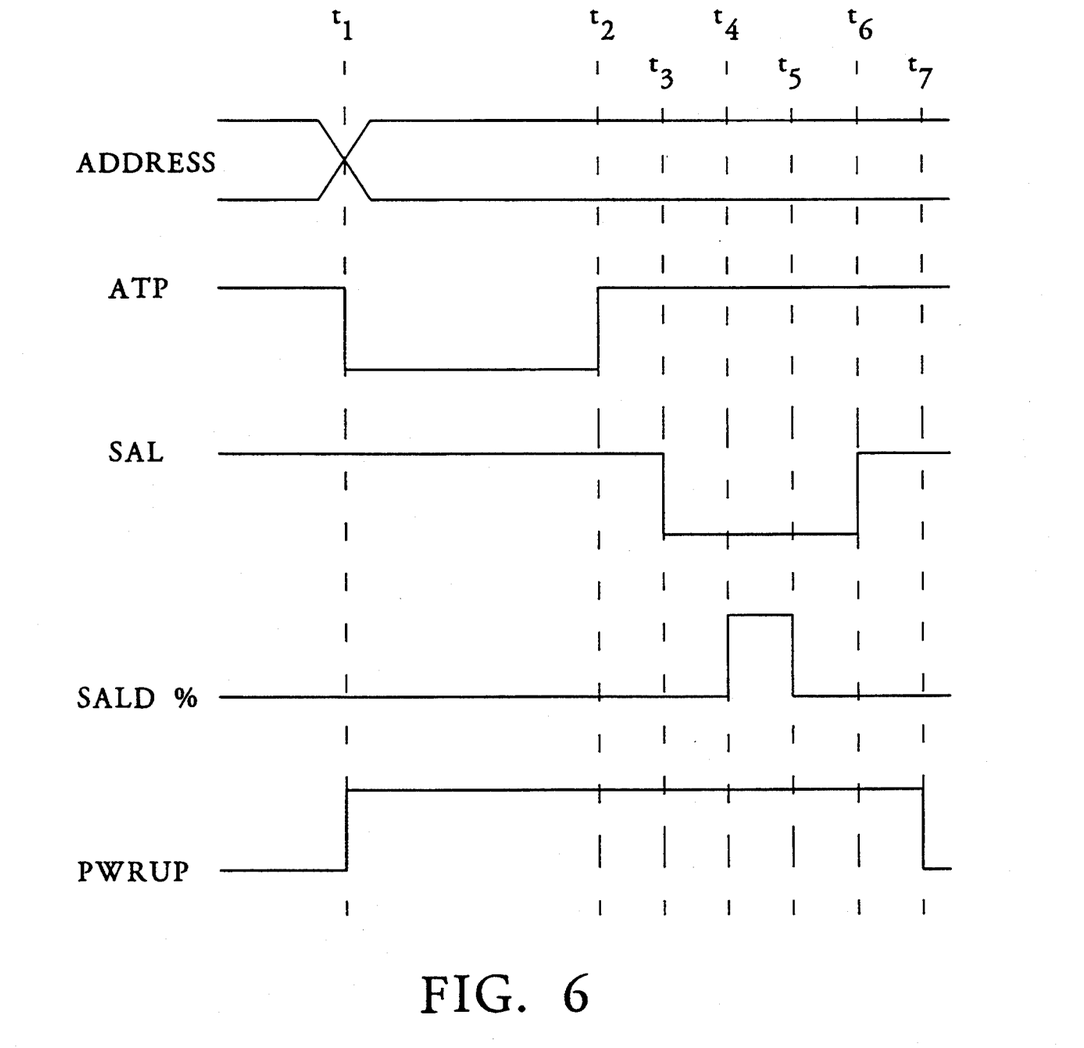
FIG. 6 is a timing diagram of the power-up, power-down, and control signals required for implementation of the process described in connection with FIG. 7.

FIG. 6 provides an indication of the pulse timing produced for respective signals ADDRESS, ATP, SAL, SALD%, and PWRUP, which are produced or processed with respect to the circuitry shown in FIG. 5. As has already been indicated, ATP is the signal input to inverter 131 of FIG. 5. Further, SAL is the output signal from NAND gate 142. Finally, SALD% is the output signal from NOR gate 154. As shown in the timing diagram of FIG. 6, the input signal to inverter 131, ATP, transitions from high to low at a particular time, $t_1$, followed by an upward transition, from high to low at time, $t_2$. The impact of these transitions of ATP is to produce a time-delayed low pulse in SAL which is maintained between times, $t_3$ and $t_6$. The output signal SALD% from NOR gate 154 transitions high within the time envelope of low pulse signal SAL, by rising high during the time interval, $t_4$ through $t_5$.

The two signals, SAL and SALD%, are effective, as indicated below, to implement the memory storage routine required to operate the circuitry of FIG. 4. In particular, at the end of a particular power-up activity and in preparation for power-down operation, the internal timing pulse, ATP, transitions to a high state, as indicated at $t_2$. After that time at $t_3$, master latch circuit 112 is disconnected from sense amplifier 29. This is accomplished by the action of signal SAL on the gate of pass transistor 118, which has the effect of closing transistor 118 and not permitting appreciable electric currents to flow therethrough. Further, master latch circuit 112 is connected to slave latch circuit 114, by the closing of transistor 119, which permits the output signal from master latch circuit 112 to be applied to the input of slave latch circuit 114 for application in turn to input-/output buffer 116. By disconnecting the master latch circuit 112 from the sense amplifier 29 at $t_3$, and connecting the master latch circuit 112 to the slave latch circuit 114 at $t_4$, noise free sensing without output switching during sensing operation is accomplished. Further, robust output data storage during output switching is accomplished.

Figure 7:
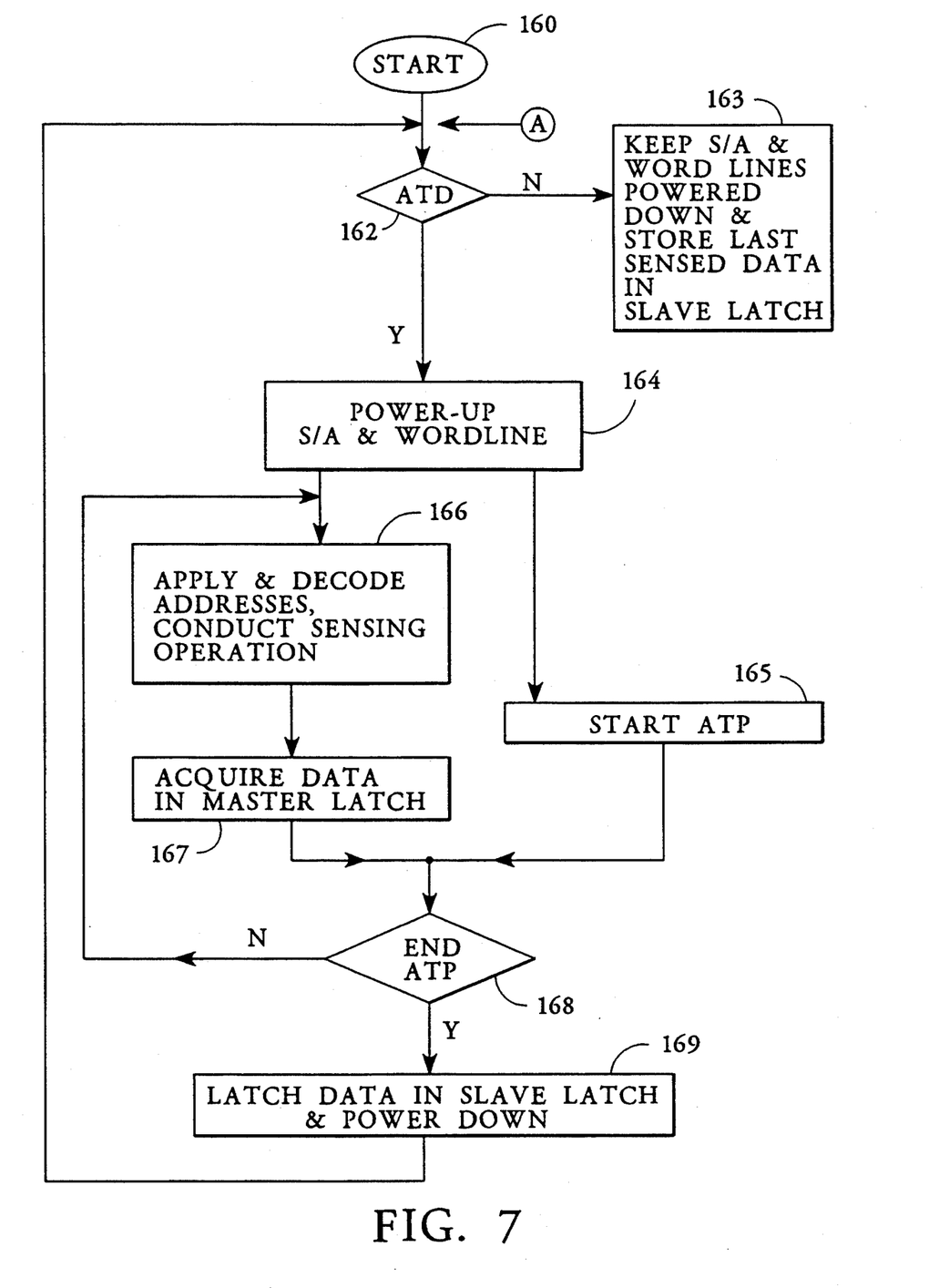
FIG. 7 is a flow diagram directed toward details of the power-up and power-down processes according to the invention herein.

The complete power-up and power-down processes of the invention in connection with read operation are summarized in FIG. 7. In particular, the processes begin with start indication oval 160. If there has been a recent address change (as by an address transition detection, or "ATD") within core memory, as suggested at decision block 162, then power-up operation is conducted as to sense amplifier 29 and word line 19, as suggested in block 164. Power-up includes applying the appropriate bias voltages on the bit, sense, and word lines needed for read operation, as discussed above. If there has been no recent address change, then operation continues as suggested at block 163. In particular, block 163 shows that sense amplifier 29 and the word lines 19 will be powered down and the last sensed data in the slave latch circuit 114 will be stored. After power-up of the sense amplifier 29 and word line 19, the applicable addresses are applied and decoded, and sensing operation is conducted as to a new memory location, as indicated at block 166. Next, according to block 167, sensed data is acquired in master latch circuit 112. In parallel with the actions according to blocks 166 and 167, the signal ATP is initiated or started, as suggested at block 165. After the data has been acquired in the master latch circuit 112 according to step 167, a query is conducted per decision block 168, whether ATP is to be ended or not. If ATP is not to be ended, then control continues with a repeat of the activities of block 166 directed toward the application and decoding of a new address and the beginning of a new sensing operation. On the other hand, if ATP is to be completed or ended, then the data is latched in slave latch circuit 114, as suggested at block 169. Finally, after power-down operation has been completed, control returns to point "A" in FIG. 7, and a check is again made whether there has been a recent address change in accordance with block 162.

As a result of the implementation of this scheme, including the power-down and reduced voltage states of the word-line respectively after sensing has been completed and when erase operation is conducted, and the concomitant power-down effects upon the sense lines connected to the variable threshold transistors in core memory, the beneficial effect of reducing stress in core memory has been accomplished. This reduced stress advances the life and reliability of the core memory cell. The description above discloses but a portion of the invention, which is claimed below in its completeness.

What is claimed is:

1. A non-volatile semiconductor memory cell arrangement comprising:
   a memory cell including first and second memory cell transistor arrangements, the second memory cell transistor arrangement including a variable threshold transistor, each of said first and second memory cell transistor arrangements including respective input, output, and control connections, and the input connection of the first memory cell transistor arrangement being connected to the output connection of said second memory cell transistor arrangement;
   a word line connected to the control connection of said first memory cell transistor arrangement to permit cell selection;
   a sense line connected to the control connection of said second memory cell transistor arrangement;
   a bit line connected to the output connection of said first memory cell transistor arrangement to enable sensing of the memory state of said variable threshold transistor; and
   sense line latch means for applying an erase voltage level on said sense line being much greater than a voltage level present on said word line, during an erase operation of said memory cell, thereby reducing the voltage stress levels on said word line.

2. A non-volatile semiconductor memory arrangement according to claim 1, further comprising sense latch means for applying one of selected voltage levels to said sense line, said selected voltage levels including a supply voltage level, a reference voltage, and an erase voltage level.

3. A non-volatile semiconductor memory arrangement according to claim 2, wherein said sense latch means is effective for applying a voltage on said sense line sufficient to erase said variable threshold transistor.

4. A non-volatile semiconductor memory arrangement according to claim 1, further comprising means for applying selected Voltages to said sense line at a plurality of locations, said applying means including a plurality of transistors, each of which has a drain connected in common with a power supply, a source connected in common with said sense line, and a gate connected in common with said word line.

5. A non-volatile semiconductor memory arrangement according to claim 4, further comprising means for grounding said sense line.

6. A non-volatile semiconductor memory arrangement according to claim 5, wherein said means for grounding is controlled by a word latch means.

7. A non-volatile semiconductor memory arrangement according to claim 1, further comprising means for grounding the control connection of said second memory cell transistor arrangement synchronously with power-down of said word line, whereby stress in said memory arrangement is reduced.

8. A non-volatile semiconductor memory arrangement according to claim 7, wherein said means for grounding is controlled by the voltage state of said word line.

9. A non-volatile semiconductor memory arrangement according to claim 1, further comprising a data latching arrangement, connected to the output of said sense amplifier, for securing data found in said memory cell, said data latching arrangement being effective for maintaining the secured data after power down of said word and sense lines, whereby stress is reduced in reading data in said memory arrangement.

10. A non-volatile semiconductor arrangement according to claim 7, wherein said means for grounding includes a transistor having a control gate which is connected to the word line through an inverting device.

11. A non-volatile semiconductor arrangement according to claim 10, wherein a latch is employed for inverting the voltage state of said word line.

12. A method of conducting memory cell operation in a semiconductor memory including the steps of:
   connecting a select transistor and a variable threshold transistor in series in a non-volatile memory cell, each of the transistors including a control connection, and connecting them at their respective control connections respectively to a word and a sense line, and said select transistor includes a drain connection connected electrically to a bit line and a sense amplifier,
   individually controlling the voltage states of said sense and word lines to ensure synchronous power-down of said sense line when the word line receives a power-down signal; and
   grounding the control connection of said variable threshold transistor during memory cell power down.

13. A method of conducting an erase operation on a selected memory cell of a non-volatile semiconductor memory having select circuitry and a variable threshold transistor for storing memory state information, said select circuitry being controlled by a word line and the memory state of said variable threshold transistor being controlled by a sense line, said method comprising the steps of:
   applying an erase voltage level to said sense line effective for erasing memory state information on said variable threshold transistor; and
   applying a voltage upon said word line which is less than said erase voltage level, to limit the stress upon said word line during erase operations.

14. A non-volatile semiconductor memory cell arrangement, comprising a non-volatile memory cell including first and second memory cell transistors connected in series, the second memory cell transistor being a variable threshold programmable transistor, each of said first and second memory cell transistors including respective input, output, and control connections, the output connection of said first memory cell transistor being connected to a bit line for sensing the memory state of said second memory cell transistor, and the input side of the first memory cell transistor being connected to the output side of said second memory cell transistor; a word line connected to the control connection of said first memory cell transistor; a sense line connected to the control connection of said second memory cell transistor; a reference voltage pass transistor means for applying a predetermined bias voltage at distributed locations of said sense line, said means for applying being under control of said word line; and means for selectably grounding said sense line and the control gate of said second memory cell transistor.

15. A non-volatile semiconductor memory cell arrangement according to claim 14, further comprising word line means for setting the voltage level on said word line, said word line means being effective for grounding said sense line in synchronism with a power-down signal on said word line.

16. A non-volatile semiconductor memory cell arrangement according to claim 14, further comprising means for applying a voltage level focussed on said sense line and sufficient to erase the memory state of said second memory cell transistor.

* * * * *